(12) United States Patent
Oda et al.

(10) Patent No.: US 7,355,128 B2
(45) Date of Patent: Apr. 8, 2008

(54) WIRED CIRCUIT BOARD

(75) Inventors: Takashi Oda, Osaka (JP); Yasufumi Miyake, Osaka (JP); Tadao Ohkawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/213,901

(22) Filed: Aug. 30, 2005

(65) Prior Publication Data

US 2006/0042823 A1    Mar. 2, 2006

(30) Foreign Application Priority Data

Sep. 1, 2004   (JP) ............................. 2004-254852

(51) Int. Cl.
*H01R 12/04* (2006.01)
*H05K 1/11* (2006.01)

(52) U.S. Cl. ...................................... 174/261; 361/767
(58) Field of Classification Search ................ 174/261; 361/767–771
See application file for complete search history.

(56) References Cited

U.S. PATENT DOCUMENTS

| | | | |
|---|---|---|---|
| 5,311,404 A * | 5/1994 | Trask et al. ................. | 361/762 |
| 6,108,212 A * | 8/2000 | Lach et al. .................. | 361/768 |
| 6,198,052 B1 | 3/2001 | Omote et al. | |
| 6,239,983 B1 * | 5/2001 | Shingai et al. ............... | 361/768 |
| 6,395,993 B1 * | 5/2002 | Nakamura et al. .......... | 174/254 |
| 6,809,415 B2 * | 10/2004 | Tsukada et al. ............. | 257/693 |
| 7,098,407 B2 * | 8/2006 | Kim et al. ................... | 174/257 |

FOREIGN PATENT DOCUMENTS

| | | |
|---|---|---|
| JP | 2002-185133 | 6/2002 |
| JP | 2004-179341 | 6/2004 |

\* cited by examiner

*Primary Examiner*—Jeremy C Norris
(74) *Attorney, Agent, or Firm*—Jean C. Edwards, Esq.; Akerman Senterfitt

(57) ABSTRACT

A wired circuit board having improved adhesion between the conductive pattern and an insulating layer to prevent a plating solution from remaining between a metal plating layer and the insulating layer. The invention prevents ionic impurities in the plating solution from remaining as residual or ionic contamination, thereby preventing a short circuit from developing when electric current flows through the circuit under a high temperature and high humidity environment. Lower end portions of the terminal portions that are formed on an insulating base layer and lower end portions of side surfaces and metal plating layers that cover the terminal portions are embedded in the insulating base layer in a flexible wired circuit board.

3 Claims, 3 Drawing Sheets

WIRED CIRCUIT BOARD

BACKGROUND OF THE INVENTION

1. Field of the Invention

This application claims of priority from Japanese Patent Appln. No. 2004-254852, filed Sep. 1, 2004, the contents of which are herein incorporated by reference in their entirety.

The present invention relates to a wired circuit board and, more particularly, to a wired circuit board used for electronics.

2. Description of the Prior Art

In general, a wired circuit board, such as a flexible wired circuit board, comprises an insulating base layer, a conductive pattern formed on the insulating base layer, and an insulating cover layer formed on the insulating base layer to cover the conductive pattern.

This general wired circuit board is required to improve adhesion of the conductive pattern to the insulating base layer to prevent stripping of the conductive pattern from the insulating base layer, for improvement in fine pitch of the conductive pattern.

For example, a technique has been proposed to ensure the adhesion of the circuit to the insulating layer by adhesively bonding a resin film consisting primarily of thermosetting resin to a substrate to form an insulating layer in the B stage state on the substrate, then forming the circuit on the insulating layer by plating, then embedding the circuit in the insulating layer under pressure, and finally curing the insulating layer completely to the C stage state (Cf. JP Laid-open (Unexamined) Patent Publication No. 2004-179341, for example).

In this wired circuit board, the conductive pattern is partly exposed from the insulating cover layer, and the exposed portion of the conductive pattern is formed as a connecting terminal portion for connecting to external terminals.

It is known that in order to improve the reliability of the connecting terminal portion connecting to the external terminals or prevent the corrosion, a metal plating layer, such as a nickel plating layer and a gold plating layer, is formed on a surface of the connecting terminal portion (Cf. JP Laid-open (Unexamined) Patent Publication No. 2002-185133, for example).

However, in this wired circuit board, there is the possibility when the metal plating layer is formed, a plating solution may infiltrate in an interface between the metal plating layer and the insulating base layer and remain therein, so that ionic impurities in the plating solution, such as chloride ion, may remain as a residual or ionic contamination. When electric current flows through the circuit under a high temperature and high humidity environment over a long term in the state of such a residual remaining, a short circuit may occur from ionic migration, then leading to insulating failure.

The method disclosed by JP Laid-open (Unexamined) Patent Publication No. 2004-179341 as cited above may provide improved adhesion between the insulating base layer and the conductive pattern, but suffers from difficulties in preventing occurrence of the short circuit from the ionic migration.

SUMMARY OF THE INVENTION

It is an object of the invention to provide a wired circuit board which even when a conductive pattern is formed in the form of fine pitch can provide improved adhesion between the conductive pattern and an insulating layer to prevent a plating solution from remaining between metal plating layers and the insulating layer, so as to prevent ionic impurities in the plating solution from remaining as residual or ionic contamination, whereby even when electric current flows through the circuit under a high temperature and high humidity environment over a long term, a short circuit from ionic migration can be prevented to suppress insulating failure.

The present invention provides a wired circuit board comprising an insulating layer, and a conductive pattern formed on the insulating layer, wherein the conductive pattern includes terminal portions, and metal plating layers are formed on surfaces of the terminal portions, and the terminal portions and the metal plating layers are partly embedded in the insulating layer.

In the wired circuit board of the present invention, it is preferable that the metal plating layers are laid over the terminal portions to cover side surfaces and upper surfaces of the terminal portions, and end portions of the terminal portions on the insulating layer side, and end portions of side surfaces of the metal plating layers on the insulating layer side are embedded in the insulating layer.

According to the wired circuit board of the present invention, the terminal portions and the metal plating layers are both partly embedded in the insulating layer. This constituent can provide the result that even when the conductive pattern is formed in the form of fine pitch, improved adhesion can be provided between the conductive pattern and the insulating layer to prevent infiltration of a plating solution into an interface between the metal plating layers and the insulating layer when the metal plating layer is formed. This can provide the result of preventing the ionic impurities in the plating solution from remaining as residual or ionic contamination in between the metal plating layers and the insulating layer. As a result, even when electric current flows through the circuit under a high temperature and high humidity environment over a long term, a short circuit from ionic migration can be prevented to suppress insulating failure.

DETAILED DESCRIPTION OF THE PREFERRED EMBODIMENTS

Figure 1:
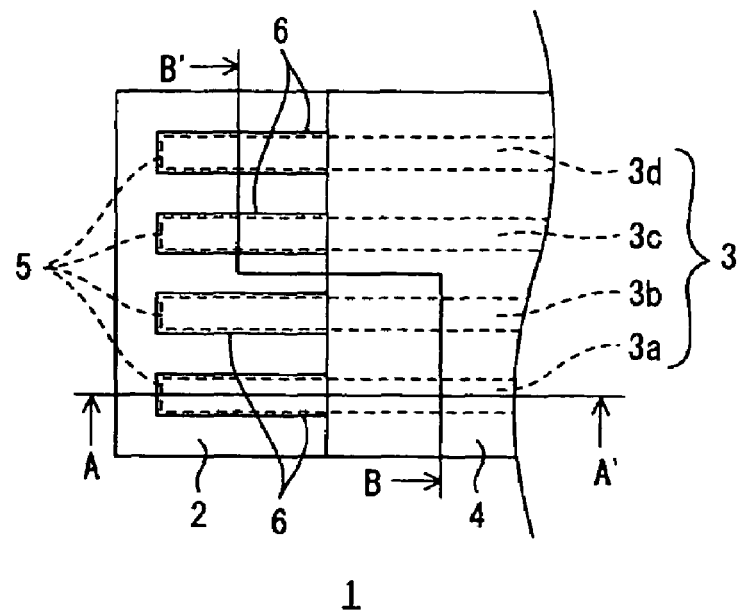
FIG. 1 shows an embodiment of a flexible wired circuit board presented as a wired circuit board of the present invention,
  (a) showing a plan view of a principal part of the same,
  (b) showing a sectional view of the same taken along line A-A' of (a), and
  (c) showing a sectional view of the same taken along line B-B' of (a)
Figure 1:
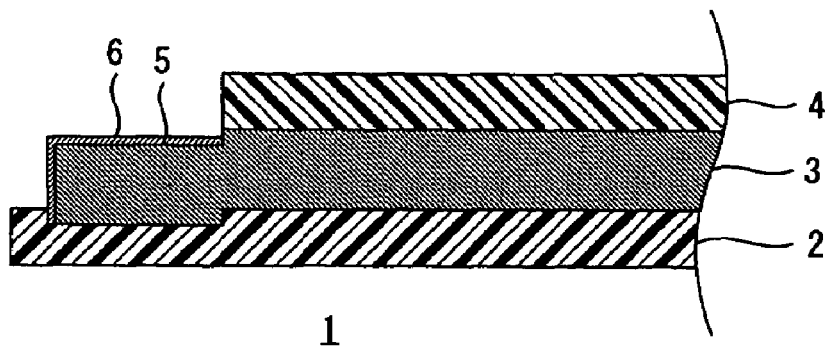
Figure 1:
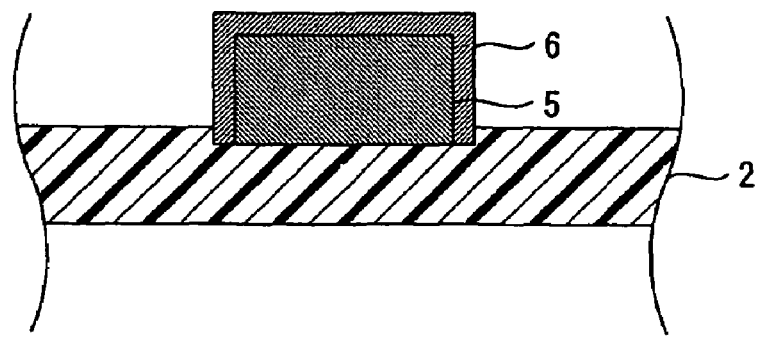

FIG. 1 shows an embodiment of a flexible wired circuit board presented as a wired circuit board of the present invention, (a) showing a plan view of a principal part of the same, (b) showing a sectional view of the same taken along line A-A' of (a), and (c) showing a sectional view of the same taken along line B-B' of (a).

A flexible wired circuit board 1 is formed in a longitudinally extending band plate form and comprises, as shown in FIG. 1(b), an insulating base layer 2 presented as an insulating layer, a conductive pattern 3 formed on the insulating base layer 2, and an insulating cover layer 4 formed on the insulating base layer 2 to cover the conductive pattern 3.

As shown in FIG. 1(a), one longitudinal end portion of the insulating base layer 2 is formed in a generally rectangular form, when viewed from top, on which the conductive pattern 3 is formed as a pattern configured by a plurality of wires 3a, 3b, 3c, and 3d.

The wires 3a, 3b, 3c, and 3d are extended to a location near one longitudinal end of the flexible wired circuit board 1 along a longitudinal direction of the flexible wired circuit board 1. Also, these wires are spaced apart from each other at a predetermined distance and arranged in parallel along a widthwise direction of the flexible wired circuit board 1 (a direction orthogonal to the longitudinal direction thereof).

The insulating cover layer 4 is formed on the insulating base layer 2 to cover over the wires 3a, 3b, 3c, and 3d extending from a location spaced apart from the one longitudinal end of the flexible wired circuit board 1 toward the other longitudinal end thereof.

In other words, the insulating cover layer 4 is not formed in a region extending between the one longitudinal end of the flexible wired circuit board 1 and the one longitudinal end of the insulating cover layer 4, so that the insulating base layer 2 and the wires 3a, 3b, 3c, and 3d in that region are exposed from the insulating cover layer 4. The exposed portions of the wires 3a, 3b, 3c, and 3d are presented in the form of terminal portions 5 of generally rectangular form when viewed from top.

Also, metal plating layers 6 are formed on respective surfaces of the terminal portions 5, i.e., an upper surface, both widthwise side surfaces, and one longitudinal side surface of each terminal 5, all of which are exposed from the insulating cover layer 4.

Then, in this flexible wired circuit board 1, lower end portions (end portions on the insulating base layer 2 side) of terminal portions 5 and lower end portions (end portions on the insulating base layer 2 side) of side surfaces (both widthwise side surfaces and one longitudinal side surface) of the metal plating layers 6 covering over the terminal portions 5 are embedded in the insulating base layer 2.

Next, a production method of this flexible wired circuit board 1 will be described with reference to FIG. 2. Also, the process of embedding the lower end portions of the terminals 5 and the lower end portions of the side surfaces of the metal plating layers 6 in the insulating base layer 2 will be described in detail.

Figure 2A:
FIG. 2 illustrates a production process of the flexible wired circuit board shown in FIG. 1,
  (a) illustrating the process of preparing an insulating base layer,
  (b) illustrating the process of forming a conductive pattern on the insulating base layer,
  (c) illustrating the process of forming an insulating cover layer,
  (d) illustrating the process of forming a metal plating layer on surfaces of respective terminal portions, and
  (e) illustrating the process of embedding lower end portions of the respective terminal portions and lower end portions of side surfaces the respective metal plating layers in the insulating base layer.

In this method, the insulating base layer 2 is prepared, first, as shown in FIG. 2(a). No particular limitation is imposed on the material used for the insulating base layer 2 of the flexible wired circuit board 1, as long as the material may be used for the insulating base layer 2. For example, a synthetic resin in film form, such as polyimide resin, polyamideimide resin, acrylic resin, polyether nitrile resin, polyether sulfonic resin, polyethylene terephthalate resin, polyethylene naphthalate resin, and polyvinyl chloride resin, can be used as the insulating base layer 2. Preferably, material having a glass-transition temperature (Tg) of 150-300° C. is used in terms of workability. Of these resin films, a polyimide resin film is preferably used in terms of heat resistance. The insulating base layer 2 has a thickness of e.g. 5-50 µm, or preferably 10-30 µm.

Then, the conductive pattern 3 is formed on the insulating base layer 2, as shown in FIG. 1(b). No particular limitation is imposed on the formation of the conductive pattern 3. A known patterning process such as an additive process and a subtractive process, may be used for forming the conductive pattern 3.

In the additive process, a thin metal film serving as a seed film is formed on the entire surface of the insulating base layer 2, first. Preferably, the thin metal film can be formed by a thin film forming process, such as a sputtering process, using chromium, nickel, copper and alloys thereof. Then, a plating resist of a reverse pattern to the conductive pattern 3 is formed on a surface of the thin metal film. The plating resist may be formed by a known process using a dry film photoresist. Thereafter, the conductive pattern 3 is formed on a surface of the insulating base layer 2 exposed from the plating resist. The conductive pattern 3 can be formed from copper and the like by electrolytic plating. Thereafter, the plating resist is removed by etching or by stripping and then the thin metal film exposed from the conductive pattern 3 is removed by etching.

In the subtractive process, a metal foil, such as a copper foil, is laminated on the entire surface of the insulating base layer 2, using, if necessary, an adhesive layer, first. A known two-layer base material produced previously laminating the insulating base layer 2 on the metal foil may be used. Then, an etching resist having a corresponding pattern to the conductive pattern 3 is formed on the metal foil. The etching resist can be formed by a known method using a dry film resist. Then, the metal foil exposed from the etching resist is etched. Thereafter, the etching resist is removed by etching or by stripping.

The conductive pattern 3 is formed in the form of a pattern comprising the plurality of wires 3a, 3b, 3c, and 3d by the process mentioned above. A width of each wire 3a, 3b, 3c, 3d is in the range of e.g. 10-200 µm, or preferably 15-50 µm, and a distance between adconnecting wires is in the range of e.g. 10-200 µm, or preferably 15-50 µm. Also, a thickness of the conductive pattern 3 is in the range of e.g. 3-50 µm, or preferably 5-20 µm.

Figure 2B:
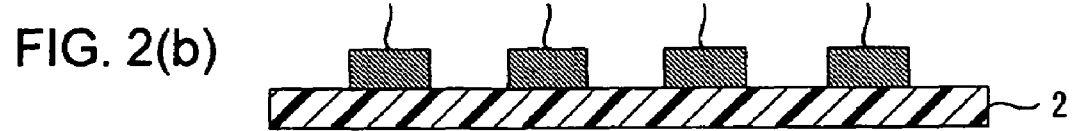
Figure 2C:
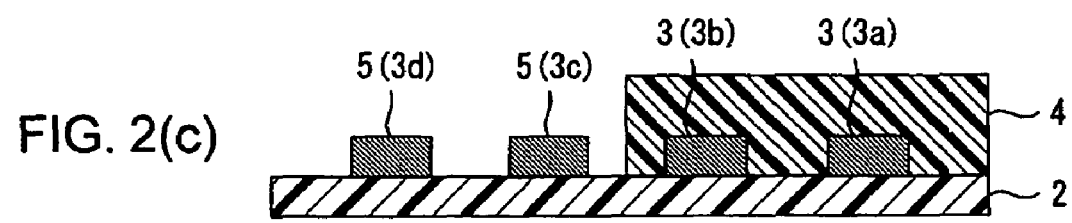

Then, the insulating cover layer 4 is formed, as shown in FIG. 2(c).

The insulating cover layer 4 is formed from the same synthetic resin as that of the insulating base layer 2. For example, epoxy resins or urethane resins may be used for forming the insulating cover layer 4. Among the synthetic resins cited above, a photosensitive resin, or preferably a photosensitive polyimide precursor resin (polyamic acid resin), is preferably used for the insulating cover layer 4.

The insulating cover layer 4 can be formed in the following processes. For example, varnish of the photosensitive resin is coated over the entire surface of the insulating base layer 2 including the conductive pattern 3, first. Then, the varnish coated is exposed to light through a photo mask and then is developed so that it is patterned so that the insulating base layer 2 and the conductive pattern 3 can be exposed from the varnish in the one longitudinal end portion of the flexible wired circuit board 1 (in other words, so that the insulating cover layer 4 cannot be formed in the one longitudinal end portion of the flexible wired circuit board 1).

Then, the varnish is dried and then cured by heating. This can produce the result that the insulating cover layer 4 for covering the conductive pattern 3 is laid over the insulating base layer 2 not to cover the one longitudinal end portion of the flexible wired circuit board 1.

Alternatively, the insulating cover layer 4 may be formed by using, for example, a previously trimmed synthetic resin film, instead of the photosensitive synthetic resin. In this alternation, the previously trimmed synthetic resin film is adhesively bonded onto the insulating base layer 2 including the conductive pattern 3 through an adhesive layer, if necessary, not to cover the one longitudinal end portion of the flexible wired circuit board 1.

The insulating cover layer 4 is formed to have a thickness of e.g. 3-50 μm, or preferably 5-30 μm, (including a thickness of the adhesive layer, if any).

As a result of this, exposed portions of the wires 3a, 3b, 3c, 3d of the conductive pattern 3 exposed from the insulating cover layer 4 in the one longitudinal end portion of the flexible wired circuit board 1 are presented in the form of the terminal portions 5 of a generally rectangular form when viewed from top.

Figure 2D:
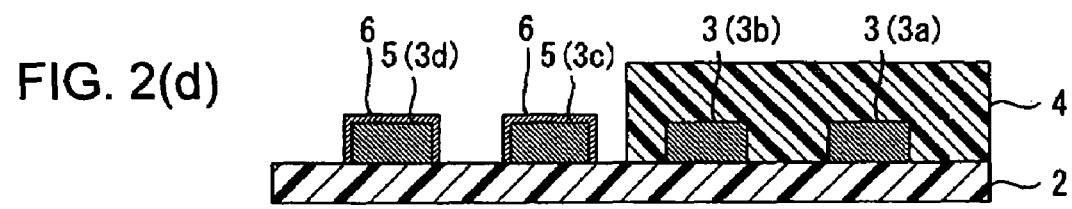

Then, the metal plating layer 6 is formed on surfaces of each of the terminals 5, i.e., a top surface, both widthwise side surfaces, and one longitudinal side surface of each of the terminals 5 which are all exposed, as shown in FIG. 2(d).

The metal plating layer 6 is formed of e.g. gold or nickel and is formed by plating, such as electrolytic plating or electroless plating. Preferably, the electroless gold plating or the electroless nickel plating is used for forming the metal plating layer 6. When the metal plating layer 6 is the gold plating layer, it has a thickness of e.g. 0.1-1 μm, while on the other hand, when the metal plating layer 6 is the nickel plating layer, it has a thickness of e.g. 0.5-5 μm.

Figure 2E:
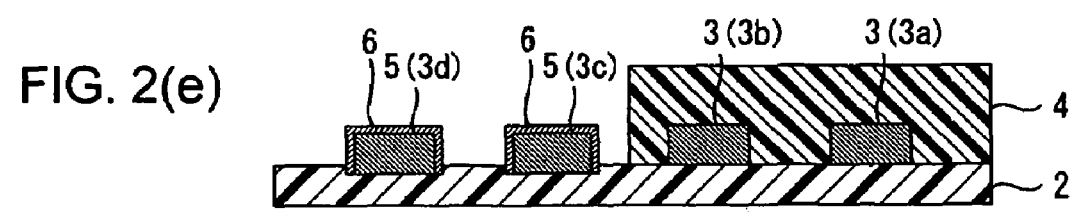

Then, in this method, the lower end portions of the each terminal portion 5 and the lower end portions of the side surfaces of the each metal plating layer 6 covering the each terminal portion 5 are embedded in the insulating base layer 2 in a thickness direction thereof, as shown in FIG. 2(e). The flexible wired circuit board 1 is produced in the method mentioned above.

The embedment of the lower end portions of the each terminal portion 5 and the lower end portions of the side surfaces of the each metal plating layer 6 in the insulating base layer 2 is accomplished by hot pressing from the top of the metal plating layer 6 covering the each terminal portion 5 toward the insulating base layer 2. For example, the conditions for the hot pressing are such that the temperature is a glass transition temperature or more, or preferably 150-350° C., and the pressure is in the range of 0.2-10 kN/cm$^2$, or preferably 0.3-5 kN/cm$^2$.

An embedment depth of the lower end portions of the each terminal portion 5 and the lower end portions of the side surfaces of the each metal plating layer 6 in the insulating base layer 2 is e.g. 1 μm or more and the embedment ratio is 50% or less of the thickness of the insulating base layer 2. When the embedment depth is less (shallower) than that, there is the possibility that a short circuit from ionic migration may occur. On the other hand, when the embedment depth is more (deeper) than that, there is the possibility that in the embedding process, the terminal portions 5 may penetrate the insulating base layer 2 in the thickness direction or the insulating base layer 2 may be deformed.

In the flexible wired circuit board 1 thus produced, the lower end portions of the each terminal portion 5 are embedded in the insulating base layer 2 so that they can be situated on the thicknesswise inside of the insulating base layer 2. This constituent can provide the result that even when the conductive pattern 3 is formed in the form of fine pitch, improved adhesion can be provided between the conductive pattern 3 and the insulating base layer 2.

Also, in this flexible wired circuit board 1, not only the lower end portions of the each terminal portion 5 but also the lower end portions of the side surfaces of the each metal plating layer 6 covering the each terminal portion 5 are embedded in the insulating base layer 2 so that they can be situated on the thicknesswise inside of the insulating base layer 2. This constituent can provide the result that even when the conductive pattern 3 is formed in the form of fine pitch, a plating solution can be prevented from infiltrating into between the metal plating layers 6 and the insulating base layer 2 in the process of forming the metal plating layers 6. This can provide the result of preventing the ionic impurities in the plating solution from remaining as residual or ionic contamination in between the metal plating layers 6 and the insulating base layer 2. As a result, even when electric current flows through the circuit of this flexible wired circuit board 1 under a high temperature and high humidity environment over a long term, a short circuit from ionic migration can be prevented to suppress insulating failure.

In the processes illustrated in FIG. 2, the insulating base layer 2 may be formed from two or more layers different in glass transition temperature from each other. When the insulating base layer 2 is formed from two or more layers different in glass transition temperature from each other, the lower end portions of the each terminal portion 5 and the lower end portions of the side surfaces of the each metal plating layer 6 can be embedded in the insulating base layer 2 with improved accuracy of amount of embedment.

Figure 3A:
FIG. 3 illustrates a production process of another embodiment (including the step of forming a multilayered insulating base layers) of the production process of the flexible wired circuit board shown in FIG. 2,
(a) illustrating the process of preparing an insulating under layer,
(b) illustrating the process of forming an insulating base layer by laminating an insulating over layer on the insulating under layer,
(c) illustrating the process of forming a conductive pattern on the insulating base layer,
(d) illustrating the process of forming an insulating cover layer,
(e) illustrating the process of forming a metal plating layer on surfaces of respective terminal portions, and
(f) illustrating the process of embedding lower end portions of the respective terminal portions and lower end portions of side surfaces of the respective metal plating layers in the insulating base layer.
Figure 3B:

This flexible wired circuit board 1 is formed in the following processes. First, an insulating under layer 7 having a higher glass transition temperature is prepared as the insulating base layer 2, as shown in FIG. 3(a). Then, an insulating over layer 8 having a lower glass transition temperature is laminated on the insulating under layer 7 to form the insulating base layer 2, as shown in FIG. 3(b).

The insulating under layer 7 is formed of a synthetic resin having a glass transition temperature higher than a glass transition temperature of a synthetic resin used for forming the insulating over layer 8. To be more specific, a synthetic resin having a glass transition temperature of e.g. not less than 250° C., or preferably not less than 280° C., is used for the insulating under layer 7.

The insulating over layer 8 is formed of a synthetic resin having a glass transition temperature lower than a glass transition temperature of a synthetic resin used for forming the insulating under layer 7. To be more specific, a synthetic resin having a glass transition temperature of e.g. 150-300° C., or preferably 150-250° C., is used for the insulating over layer 8.

The insulating over layer 8 is laminated on the insulating under layer 7 by using a casting process, for example. The insulating under layer 7 and the insulating over layer 8 are formed so that the total thickness thereof can be substantially equal to the thickness of the insulating base layer 2 mentioned above. The insulating over layer 8 is formed to have a thickness larger than a depth corresponding to an amount of embedment of the lower end portions of the each terminal portion 5 and the lower end portions of the side surfaces of the each metal plating layer 6 in the insulating base layer 2. To be more specific, the thickness of the insulating over layer 8 is preferably set to be 5% to 50% of the thickness of the insulating base layer 2 so that physical properties of the insulating base layer 2 can be held by the insulating under layer 7.

Figure 3C:
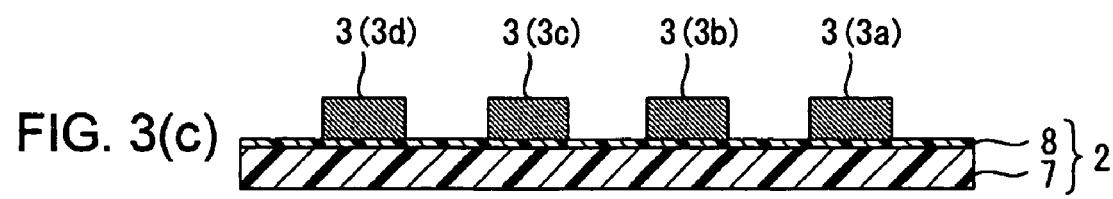
Figure 3D:
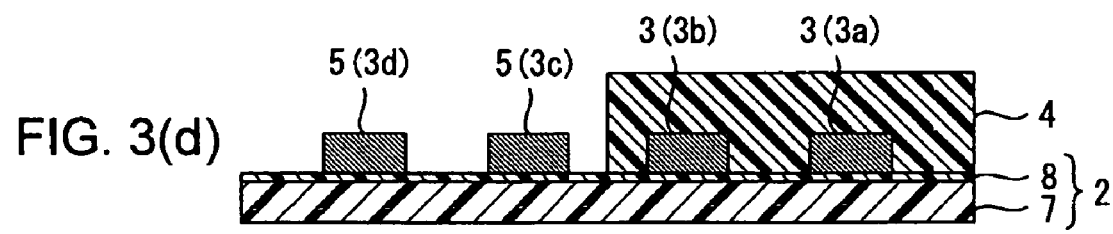
Figure 3E:
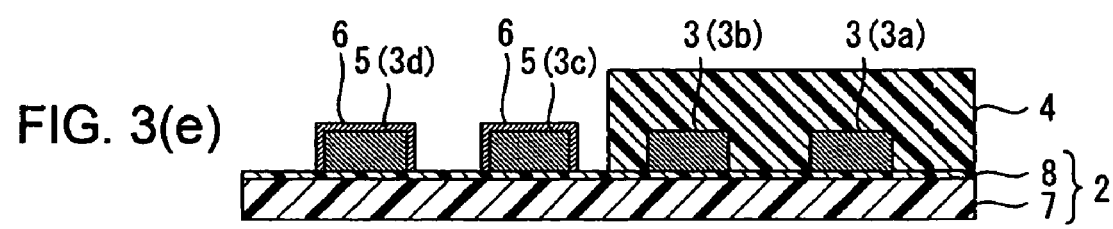
Figure 3F:
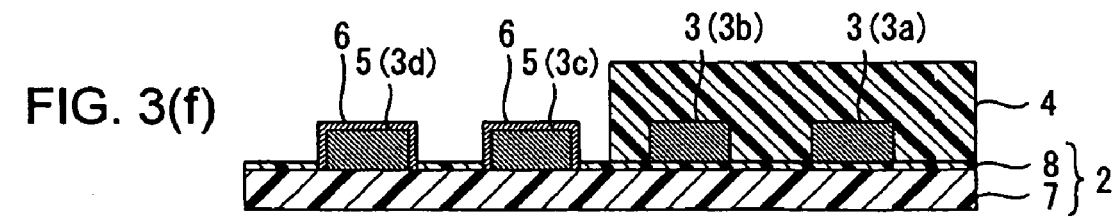

Then, the conductive pattern 3 is formed on the insulating base layer 2 in the same manner as in the process shown in FIG. 1 (Cf. FIG. 3(c)) and, thereafter, the insulating cover layer 4 is formed (Cf. FIG. 3(d)). Then, the metal plating layers 6 is formed on the respective terminal portions 5 (Cf. FIG. 3(e)) and, thereafter, the lower end portions of the each terminal portion 5 and the lower end portions of the side surfaces of the respective metal plating layers 6 for covering the terminal portions 5 are embedded so that they can be situated on the thicknesswise inside of the insulating over layer 8 of the insulating base layer 2, as shown in FIG. 3(f). The flexible wired circuit board 1 is produced in the manner mentioned above.

It is preferable in the embedding process that the embedment is carried out by hot pressing at a temperature in the range of between not less than the glass transition temperature of the synthetic resin used for forming the insulating over layer 8 and less than the glass transition temperature of the synthetic resin used for forming the insulating under layer 7. This can produce the result that the lower end portions of the each terminal portion 5 and the lower end portions of the side surfaces of the each metal plating layer 6 can be embedded in the insulating layer extending from a front surface of the insulating over layer 8 to a front surface of the insulating under layer 7 so that they can be situated on the thicknesswise inside of the insulating over layer 8 in the insulating base layer 2 with improved reliability and improved accuracy of amount of embedment.

The flexible wired circuit board 1 thus produced can provide improved adhesion between the conductive pattern 3 and the insulating base layer 2, as is the case with the above. Also, the plating solution can be prevented from infiltrating into between the metal plating layers 6 and the insulating base layer 2 in the process of forming the metal plating layers 6. As a result of this, even when electric current flows through the circuit of this flexible wired circuit board 1 under a high temperature and high humidity environment over a long term, a short circuit from ionic migration can be prevented to suppress insulating failure.

Although the wired circuit board of the present invention created as a single sided flexible wired circuit board has been illustrated above, the wired circuit board of the present invention is applicable to a double sided flexible wired circuit board and is also applicable to a rigid-flexible wired circuit board and a rigid wired circuit board.

EXAMPLES

While in the following, the present invention will be described in further detail with reference to Examples and Comparative Examples, the present invention is not limited to any of Examples and Comparative Examples.

Example 1

An insulating base layer formed by a polyimide resin film having a thickness of 25 μm and a glass transition temperature of 230° C. was prepared, first (Cf. FIG. 2(a)).

Then, a thin metal film was formed on the insulating base layer by sputtering a thin chromium film having a thickness of 0.03 μm and a thin copper film having a thickness of 0.10 μm sequentially. Then, a plating resist of a reverse pattern to the conductive pattern was formed on the thin metal film. Thereafter, a conductive pattern formed from copper was formed by electrolytic copper plating on a surface of the insulating base layer exposed from the plating resist. Thereafter, the plating resist was stripped and then the thin metal film exposed from the conductive pattern was removed by wet etching. As a result, the conductive pattern having a thickness of 10 μm was formed in a pattern comprising a plurality of wires which were spaced from each other at a distance of 30 μm (Cf. FIG. 2(b)).

Then, varnish of polyamic acid resin was coated over the entire surface of the insulating base layer including the conductive pattern. Then, the varnish coated was exposed to light through a photo mask and then was developed so that it was patterned so that the insulating base layer and the conductive pattern (terminal portions) could be exposed from the varnish in the one longitudinal end portion of the flexible wired circuit board. Thereafter, the varnish was dried and then cured by heating and thereby an insulating cover layer, formed of polyimide resin and having a thickness of 15 μm, for covering the conductive pattern was formed on the insulating base layer (Cf. FIG. 2(c)).

Then, a gold plating layer having a thickness of 0.5 μm was formed on surfaces of each terminal portion (top surface, both widthwise side surfaces, and one longitudinal side surface) (Cf. FIG. 2(d)). Thereafter, the terminal portions were subjected to hot pressing from a top of the gold plating layer covering the each terminal portion toward the insulating base layer at the temperature of 250° C. and the pressure of 0.3 kN/cm² for ten seconds. The flexible wired circuit board was produced in the manner mentioned above (Cf. FIG. 2(e)).

In the flexible wired circuit board obtained, an amount of embedment of lower end portions of each terminal portion and lower end portions of side surfaces of each gold plating layer in the insulating base layer was 2 μm.

Example 2

An insulating base layer formed by laminating an insulating over layer formed by a polyimide resin film having a thickness of 5 μm and a glass transition temperature of 230° C. on an insulating under layer formed by a polyimide resin film having a thickness of 20 μm and a glass transition temperature of 350° C. was prepared (Cf. FIG. 3(b)).

Then, a conductive pattern having a thickness of 10 μm was formed in a pattern comprising a plurality of wires spaced from each other at a distance of 30 μm in the same manner as in Example 1 (Cf. FIG. 3(c)).

Further, an insulating cover layer, formed by a polyimide resin having a thickness of 15 μm, for covering the conductive pattern was formed on the insulating base layer in the same manner as in Example 1 (Cf. FIG. 3(d)).

Then, a gold plating layer having a thickness of 0.5 μm was formed on surfaces of each terminal portion in the same manner as in Example 1 (Cf. FIG. 3(e)). Thereafter, the terminal portions were subjected to hot pressing from a top of the gold plating layer covering the each terminal portion toward the insulating base layer in the same manner as in Example 1. The flexible wired circuit board was produced in the manner mentioned above (Cf. FIG. 3(f)).

In the flexible wired circuit board obtained, an amount of embedment of lower end portions of each terminal portion and lower end portions of side surfaces of each gold plating layer in the insulating base layer was 2 μm.

Comparative Example 1

Except that the process of the hot pressing from a top of the gold plating layer covering the each terminal portion toward the insulating base layer was omitted, the same processes as those in Example 1 were taken to produce a flexible wired circuit board.

Comparative Example 2

Except that the process that after formation of the insulating cover layer, the terminal portions were subjected to hot pressing from a top of the terminal portions toward the insulating base layer at the temperature of 250° C. and the pressure of 0.3 kN/cm$^2$ for ten seconds and then gold plating layers each having a thickness of 0.5 μm were formed on surfaces (a top surface, both widthwise side surfaces, and one longitudinal side surface) of each terminal portion, the same processes as those in Example 1 were taken to produce a flexible wired circuit board.

In the flexible wired circuit board obtained, the lower end portions of the side surfaces of the gold plating layers were not embedded in the insulating base layer, and only the lower end portions of the respective terminal portions were embedded and the amount of embedment was 2 μm.

Evaluation

After the flexible wired circuit boards of Examples and those of Comparative Examples were placed under high temperature and high humidity environment of 60° C. and 95% RH, electric current flowed through the circuit at an applied voltage of 30V. Electricity was measured until an insulation resistance value was reduced to $10^6$ Ω or less (until a short circuit occurred from ionic migration) and electric reliability was evaluated by the elapsed time. The results are shown below.

Example 1 Elapsed time: 800 hours
Example 2 Elapsed time: 800 hours
Comparative Example 1 Elapsed time: 600 hours
Comparative Example 2 Elapsed time: 400 hours While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
   an insulating layer,
   a conductive pattern formed on the insulating layer, wherein the conductive pattern includes terminal portions, and
   metal plating layers that are formed on surfaces of the terminal portions, wherein a lower end portion of side surfaces of the terminal portions and a lower end portion of side surfaces of the metal plating layers are embedded in the insulting layer and wherein an upper end portion of side surfaces of the metal plating layers is not embedded in the insulating layer.

2. The wired circuit board according to claim 1, wherein the metal plating layers are laid over the terminal portions to cover side surfaces and upper surfaces of the terminal portions.

3. A wired circuit board, comprising:
   an insulating base layer;
   a conductive pattern formed on the insulating base layer; and
   an insulating cover layer formed on the insulating base layer to cover the conductive pattern,
   wherein the conductive pattern has a terminal portion that is exposed from the insulating cover layer,
   wherein a metal plating layer is formed on a surface of the terminal portion; and
   wherein a lower end portion of the terminal portion and a lower end portion of the side surface of the metal plating layer covering over the terminal portion are embedded in the insulating base layer.

* * * * *